(12) United States Patent
Luter et al.

(10) Patent No.: US 12,195,872 B2
(45) Date of Patent: Jan. 14, 2025

(54) INGOT PULLER APPARATUS THAT USE A SOLID-PHASE DOPANT

(71) Applicant: GlobalWafers Co., Ltd., Hsinchu (TW)

(72) Inventors: William L. Luter, St. Charles, MO (US); Hariprasad Sreedharamurthy, Ballwin, MO (US); Stephan Haringer, Kastelbell/Tschars (IT); Richard J. Phillips, St. Peters, MO (US); Nan Zhang, O'Fallon, MO (US); Yu-Chiao Wu, Frontenac, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 18/151,992

(22) Filed: Jan. 9, 2023

(65) Prior Publication Data
US 2023/0160094 A1    May 25, 2023

Related U.S. Application Data

(62) Division of application No. 16/875,468, filed on May 15, 2020, now Pat. No. 11,585,010.

(Continued)

(51) Int. Cl.
*C30B 15/04* (2006.01)
*C30B 15/10* (2006.01)
(Continued)

(52) U.S. Cl.
CPC .............. *C30B 15/04* (2013.01); *C30B 15/10* (2013.01); *C30B 15/14* (2013.01); *C30B 29/06* (2013.01);
(Continued)

(58) Field of Classification Search
CPC ......... C30B 15/04; C30B 15/10; C30B 15/14; C30B 29/06; C30B 35/002; C30B 35/007; Y10T 117/00; Y10T 117/10
See application file for complete search history.

(56) References Cited

U.S. PATENT DOCUMENTS 5,314,667 A    5/1994  Lim et al.
6,309,974 B1   10/2001 Strack et al.
(Continued)

FOREIGN PATENT DOCUMENTS

CN    101681805 B    5/2011
EP    2659030 B1     7/2015
(Continued)

OTHER PUBLICATIONS

ISR and Written Opinion for International Application No. PCT/US2020/033364, 14 pages, Aug. 31, 2020.

(Continued)

*Primary Examiner* — Hua Qi
(74) *Attorney, Agent, or Firm* — Armstrong Teasdale LLP

(57) ABSTRACT

Methods for producing a single crystal silicon ingot are disclosed. The ingot is doped with boron using solid-phase boric acid as the source of boron. Boric acid may be used to counter-dope the ingot during ingot growth. Ingot puller apparatus that use a solid-phase dopant are also disclosed. The solid-phase dopant may be disposed in a receptacle that is moved closer to the surface of the melt or a vaporization unit may be used to produce a dopant gas from the solid-phase dopant.

3 Claims, 13 Drawing Sheets

Related U.S. Application Data

(60) Provisional application No. 62/868,573, filed on Jun. 28, 2019.

(51) Int. Cl.
*C30B 15/14* (2006.01)
*C30B 29/06* (2006.01)
*C30B 35/00* (2006.01)

(52) U.S. Cl.
CPC .......... *C30B 35/002* (2013.01); *C30B 35/007* (2013.01); *Y10T 117/00* (2015.01); *Y10T 117/10* (2015.01)

(56) References Cited

U.S. PATENT DOCUMENTS

| | | |
|---|---|---|
| 9,786,748 B2 | 10/2017 | Caspary et al. |
| 2004/0083947 A1 | 5/2004 | Weber et al. |
| 2009/0266294 A1 | 10/2009 | Javidi |
| 2010/0175612 A1* | 7/2010 | Narushima ............ C30B 15/04 117/19 |
| 2010/0294999 A1* | 11/2010 | Narushima ............ C30B 15/04 117/214 |
| 2011/0120367 A1 | 5/2011 | Narushima et al. |
| 2012/0279437 A1 | 11/2012 | Johnson |
| 2012/0285373 A1 | 11/2012 | Meyer |
| 2014/0167731 A1 | 1/2014 | Dubois et al. |
| 2014/0033968 A1 | 2/2014 | Giannattasio et al. |
| 2014/0163913 A1 | 6/2014 | Dubois et al. |
| 2015/0203988 A1 | 7/2015 | Caspary et al. |
| 2015/0349066 A1 | 12/2015 | Caspary et al. |
| 2016/0017513 A1 | 1/2016 | Haringer |
| 2016/0130722 A1 | 5/2016 | Caspary |
| 2016/0298259 A1 | 10/2016 | Dell'Amico |
| 2016/0305040 A1 | 10/2016 | Caspary et al. |
| 2017/0062568 A1 | 3/2017 | Nico et al. |
| 2017/0247809 A1 | 8/2017 | Haringer |
| 2017/0260645 A1 | 9/2017 | Hoshi et al. |
| 2018/0019365 A1 | 1/2018 | Ralf et al. |
| 2018/0087179 A1 | 3/2018 | Zepeda et al. |
| 2018/0179660 A1 | 6/2018 | Phillips et al. |

FOREIGN PATENT DOCUMENTS

| | | | |
|---|---|---|---|
| JP | 2002128591 A | 5/2002 | |
| JP | 2002226295 A | 8/2002 | |
| JP | 2008266093 A | 11/2008 | |
| JP | 2009242142 A * | 10/2009 | ............ C30B 15/04 |
| JP | 4367213 B2 | 11/2009 | |
| JP | 2010143776 A | 7/2010 | |
| JP | 2011088180 A | 5/2011 | |
| JP | 2013129551 A * | 7/2013 | |
| JP | 5313534 B2 | 10/2013 | |
| JP | 2016060667 A | 4/2016 | |
| WO | 0186033 A1 | 11/2001 | |
| WO | 2006003782 A1 | 1/2006 | |
| WO | 2009113441 A1 | 9/2009 | |
| WO | 2013162145 A1 | 10/2013 | |
| WO | 2014014309 A1 | 9/2014 | |
| WO | 2016031164 A1 | 3/2016 | |
| WO | 2016179022 A1 | 11/2016 | |

OTHER PUBLICATIONS

Yan et al., "Trace Boron-Doping of Silicon with FZ method," Semiconductor Technology, vol. 39(01), Jan. 13, 2014, pp. 60-63.
Jochen et al., "Czochralski Growth of Silicon Crystals: 2.2 Description of the Czochralski Process", Handbook of Crystal Growth, Jan. 1, 2015, Elsevier, pp. 45-58.

* cited by examiner

INGOT PULLER APPARATUS THAT USE A SOLID-PHASE DOPANT

CROSS-REFERENCE TO RELATED APPLICATIONS

This application is a Divisional of U.S. Non-provisional Patent Application Ser. No. 16/875,468, filed May 15, 2020, which claims the benefit of U.S. Provisional Patent Application No. 62/868,573, filed Jun. 28, 2019. Both applications are incorporated herein by reference in their entirety.

FIELD OF THE DISCLOSURE

The field of the disclosure relates to methods for producing a single crystal silicon ingot in which the ingot is doped with boron using solid-phase boric acid as the source of boron. The field of the disclosure also relates to ingot puller apparatus that use a solid-phase dopant.

BACKGROUND

In high resistivity silicon wafer applications, the resistivity of the single crystal silicon ingot from which the wafers are sliced may be controlled by addition of various dopants to the melt. The dopants may be used to compensate for various impurities (e.g., boron or phosphorous) in the source of polycrystalline silicon used to form a melt from which the silicon ingot is withdrawn.

When one or more dopants are added to achieve a target resistivity in the ingot, certain dopants and/or impurities may accumulate in the melt due to differences in the segregation coefficients of the compounds. For example, boron has a segregation coefficient of about 0.8 which allows boron to be readily taken up into the growing ingot. Phosphorous has a segregation coefficient of about 0.35 which causes phosphorous to accumulate in the melt relative to boron which is taken up more readily. Accordingly, as the ingot grows and the melt is depleted, phosphorous accumulates in the melt altering the resistivity of the growing ingot. This can cause the resistivity to decrease and fall out of customer specifications and/or for a type-change to occur in the ingot.

A need exists for methods for counter-doping a silicon melt during ingot growth to increase the length of the ingot that remains within customer specifications. A need exists for doping methods that allow for use of dopant source materials that are readily available and/or relatively inexpensive and that allow the melt to be doped with relative ease. A need exits for ingot puller apparatus that allow a solid-phase dopant to be used as the source of dopant.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for producing a single crystal silicon ingot from a silicon melt held within a crucible. Polycrystalline silicon is added to the crucible. The crucible is disposed within an ingot puller inner chamber. The polycrystalline silicon is heated to cause a silicon melt to form in the crucible. A single crystal silicon ingot is pulled from the silicon melt. A source of solid-phase boric acid is provided. A boron-containing gas is produced from the solid-phase boric acid. The boron-containing gas is contacted with a surface of the melt to cause boron to enter the melt as a dopant while pulling the single crystal silicon ingot from the melt.

Yet another aspect of the present disclosure is directed to an ingot puller apparatus for producing a doped single crystal silicon ingot. The ingot puller apparatus includes an ingot puller outer housing and an ingot puller inner chamber formed within the ingot puller outer housing. A crucible is disposed within the ingot puller inner chamber. An outer feed tube is at least partially disposed exterior to the ingot puller outer housing. The outer feed tube defines an outer feed tube chamber. The outer feed tube has a distal end, a proximal end and an outer feed tube axis that extends through the distal end and the proximal end. An elongate member is moveable within the outer feed tube chamber along the outer feed tube axis. A dopant receptacle is coupled to the elongate member. The dopant receptacle is moveable between a loading position in which the dopant receptacle is disposed exterior to the ingot puller outer housing and a feed position in which the dopant receptacle is disposed within the ingot puller inner chamber.

Yet another aspect of the present disclosure is directed to an ingot puller apparatus for producing a doped single crystal silicon ingot. The ingot puller apparatus includes an ingot puller outer housing and an ingot puller inner chamber formed within the ingot puller outer housing. A crucible is disposed within the ingot puller inner chamber. A dopant conduit having a gas inlet is disposed exterior to the ingot puller inner chamber and a gas outlet is disposed in the ingot puller inner chamber. A dopant vaporization unit is disposed exterior to the ingot puller chamber. The dopant vaporization unit includes a dopant chamber for holding solid-phase dopant. The dopant vaporization unit includes a heating device for heating the solid-phase dopant and for producing a dopant gas. The dopant vaporization unit includes an outlet through which the dopant gas passes. The outlet is in fluid communication with the dopant conduit.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for doping a silicon melt (e.g., counter-doping) that involve boric acid. Additional provisions relate to ingot puller apparatus configured to dope a silicon melt and, in particular, to dope using a solid-phase dopant such as boric acid.

Methods for Doping using Boric Acid

Figure 1:
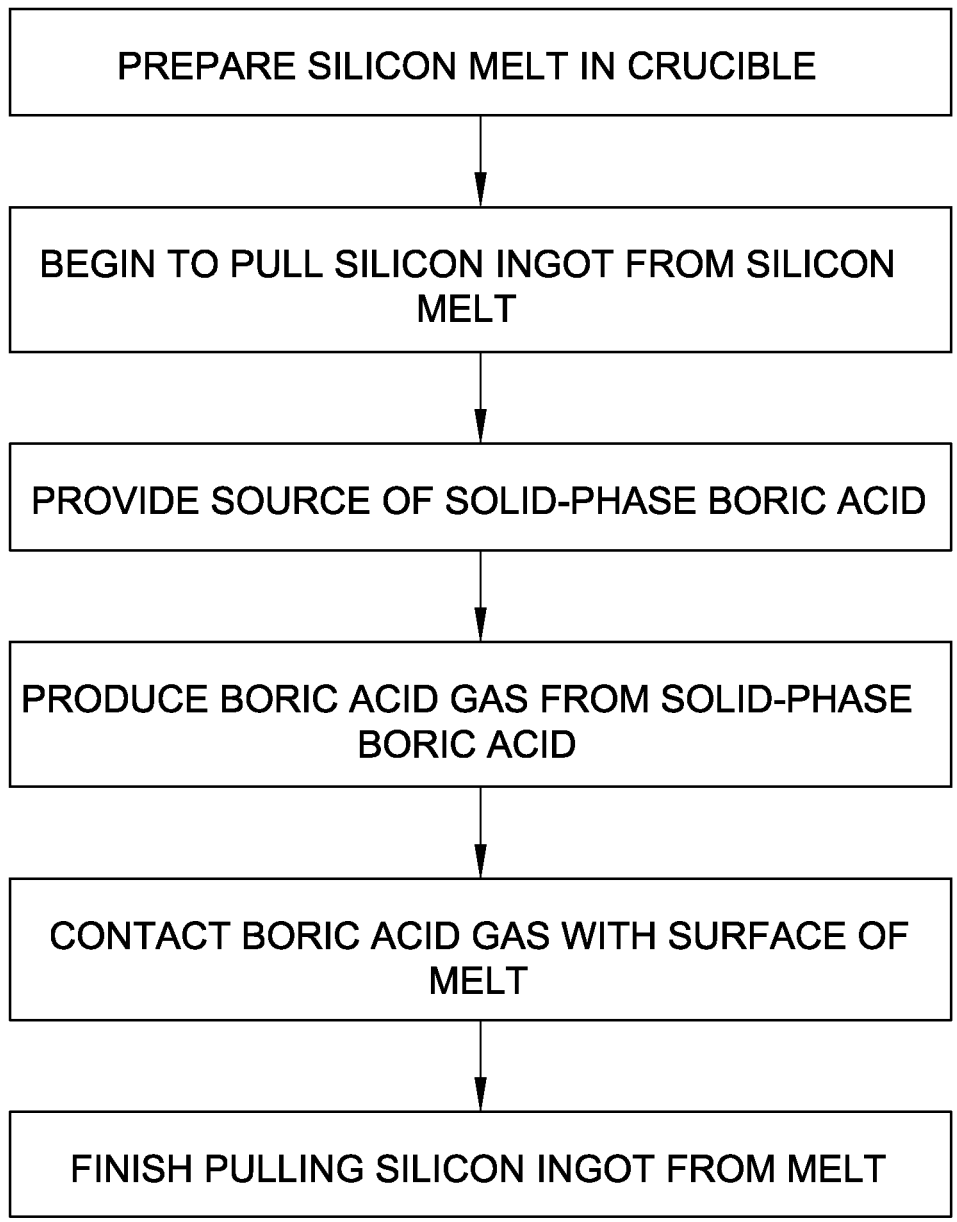
FIG. 1 is a schematic of an example method for growing a silicon ingot with boric acid as the source of dopant.

An example method of the present disclosure is shown in FIG. 1. The method may be carried out by use of an ingot puller apparatus that is configured to produce a boron-containing gas from solid-phase boric acid. Example ingot puller apparatus that may be used in accordance with the methods for doping with boric acid are shown in FIGS. 2-13. While the method may be described with reference to the ingot puller apparatus 100 shown in FIGS. 2-9 or the ingot puller apparatus 400 shown in FIGS. 10-13 to exemplify the method, the method should not be limited to the ingot puller apparatus 100, 400 unless stated otherwise.

Figure 2:
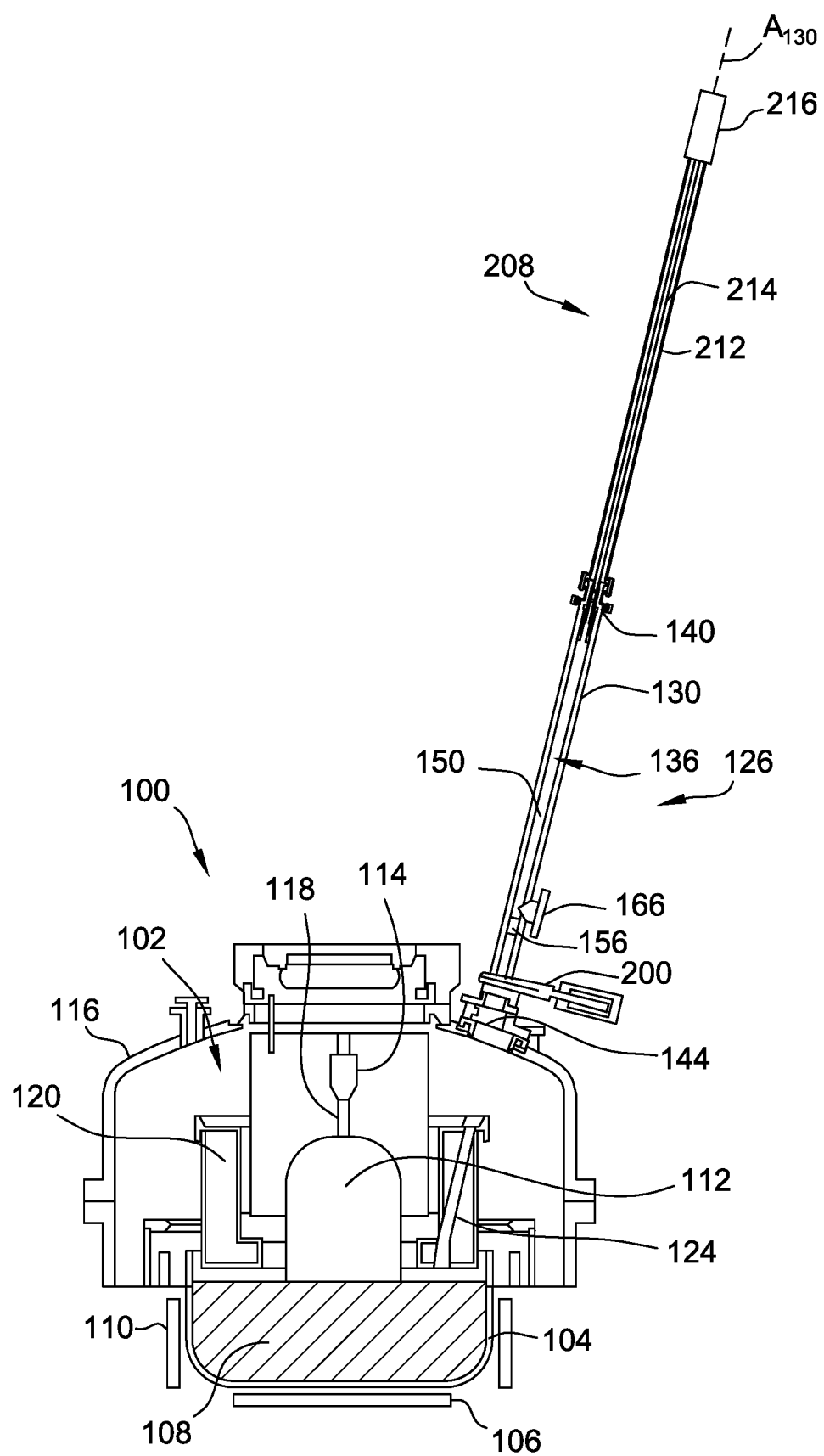
FIG. 2 is a partial cross-section side view of an embodiment of an ingot puller apparatus having a dopant receptacle in a dopant loading position.

With reference to FIG. 2, in accordance with embodiments of the method for preparing a silicon ingot, a silicon melt is prepared in a crucible 104 disposed within the inner chamber 102 of an ingot puller apparatus 100. The crucible 104 may be supported by a susceptor (not shown). The ingot puller apparatus 100 may be configured to rotate the crucible 104 and/or move the crucible 104 vertically within the ingot puller apparatus 100.

To prepare the silicon melt, polycrystalline silicon is added to the crucible 104. The polycrystalline silicon is heated to above the melting temperature of silicon (about 1414° C.) to cause the polycrystalline silicon to liquefy into a silicon melt 108. A heating system is operated to melt-down the polycrystalline silicon. For example, one or more heaters 106, 110 (FIG. 2) below or to the side of the crucible 104 are operated to melt-down the silicon.

Before or after the melt 108 is produced, the melt may be doped with a dopant, typically an n-type dopant, to compensate for p-type impurities (e.g., boron) in the melt. The n-type dopant may be added before growth of the ingot 112 commences. By compensating the melt, the resistivity of the resulting ingot 112 may be increased. For example, the seed end of the ingot (i.e., the portion of the ingot nearest the ingot crown) may have a resistivity of at least about 1,500 Ω-cm or, as in other embodiments, at least about 2,000 Ω-cm, at least about 4,000 Ω-cm, at least about 6,000 Ω-cm, at least about 8,000 Ω-cm, at least about 10,000 Ω-cm or from about 1,500 Ω-cm to about 50,000 ohm-cm or from about 8,000 Ω-cm to about 50,000 Ω-cm. Suitable n-type dopants include phosphorous and arsenic.

Once the melt 108 is prepared, a single crystal silicon ingot 112 is pulled from the melt 108. A seed crystal 118 is secured to a seed chuck 114. The seed chuck 114 and crystal 118 are lowered until the seed crystal 118 contacts the surface of the silicon melt 108. Once the seed crystal 118 begins to melt, a pulling mechanism slowly raises the seed crystal 118 up to grow the monocrystalline ingot 112.

A process gas (e.g., argon) is caused to circulate through the inner chamber 102 of the ingot puller apparatus 100. The process gas creates an atmosphere within the chamber 102.

As shown in FIG. 1, embodiments of methods of the present disclosure include providing a source of solid-phase boric acid ($H_3BO_3$). The boric acid may be relatively pure such as about 99% pure or more, 99.9% pure or more, or 99.99% pure or more. In some embodiments, the boric acid may be relatively isotopically pure (i.e., boron-11). For example, boric acid may be provided within the inner chamber 102 of the ingot puller apparatus 100 (i.e., within the housing 116) such as in the receptacle 156 (FIG. 4) of the ingot puller apparatus 100 of FIGS. 2-9. Alternatively, the solid-phase boric acid may be disposed exterior to the ingot puller outer housing 416 such as within the dopant chamber 424 of the vaporization unit 414 of the ingot puller apparatus 400 of FIGS. 10-13.

A boron-containing gas is produced from the solid-phase boric acid. The gas that is produced is generally in the form of boric acid ($H_3BO_3$) or derivatives thereof ($B_xO_yH_z^+$ complexes) and not other compounds (e.g., diborane ($B_2H_6$) or boron dihydride ($BH_2$)). However, it should be understood that other boron compounds may be added to the boron-containing gas.

The solid-phase boric acid may be heated to above its melting temperature (about 171° C.) to liquefy the solid-phase boric acid and to produce a boric acid liquid. The boric acid liquid is then heated above its vaporization temperature (about 300° C.) to produce a boron-containing gas. For example, the solid-phase boric acid may be heated by heat radiated from the silicon melt 108 in the ingot puller apparatus of FIGS. 2-9 or by a heating device 428 (FIG. 12) of the vaporization unit 414 of the ingot puller apparatus of FIGS. 10-13.

Once the boron-containing gas is produced, the boron-containing gas contacts the surface of the melt 108 to allow boron to diffuse into the melt. For example, the flow path of the boron-containing gas in the exit tube 168 (FIG. 4) may be restricted such that the boron-containing gas may only move through the tube outlet 170 as in the ingot puller apparatus 100 of FIGS. 2-9 or the boron-containing gas may be carried by a process gas as in the ingot puller apparatus 400 of FIGS. 10-13.

Once boron enters the melt, boron compensates for phosphorous which has concentrated in the melt due to the relatively low segregation coefficient of phosphorous, thereby increasing the resistivity of the remaining portion of the ingot 112 that forms in the ingot puller apparatus.

Ingot Puller Apparatus for Doping by use of Solid Dopants

An example ingot puller apparatus 100 is generally shown in FIGS. 2-9 and another example ingot puller apparatus 400 is shown in FIGS. 10-13. The apparatus 100 of FIGS. 2-9 and the apparatus 400 of FIGS. 10-13 may be used to dope the ingot with boron using solid-phase boric acid as in the method described above or may be used with other solid-phase dopants that may be vaporized below the melting point of silicon (about 1414° C.) in either the native form, or a hydrated form, or in a compound that is non-contaminating to the crystal growth process (e.g., doped glass with a relatively high concentration of $B_2O_3$ intermixed with SiO2 or a heavily doped Si—B alloy).

Referring now to FIG. 2, the ingot puller apparatus 100 includes an ingot puller outer housing 116 that defines an ingot puller inner chamber 102 within the housing 116. A crucible 104 is disposed within the ingot puller inner chamber 102. The crucible 104 contains the silicon melt 108 from which the silicon ingot 112 is pulled. The ingot 112 is shrouded by a heat shield 120.

The ingot puller apparatus 100 includes a dopant feed system 126. The dopant feed system 126 includes an outer feed tube 130 that is at least partially disposed exterior to the ingot puller housing 116. The outer feed tube 130 defines an outer feed tube chamber 136 therein. The outer tube 130 has a distal end 140 furthest from the outer housing 116 and a proximal end 144 nearest the housing 116. An outer feed tube axis $A_{130}$ extends through the distal end 140 and the proximal end 144 of the outer feed tube 130. The outer feed tube 130 may be made of stainless steel or other suitable materials.

Figure 4:
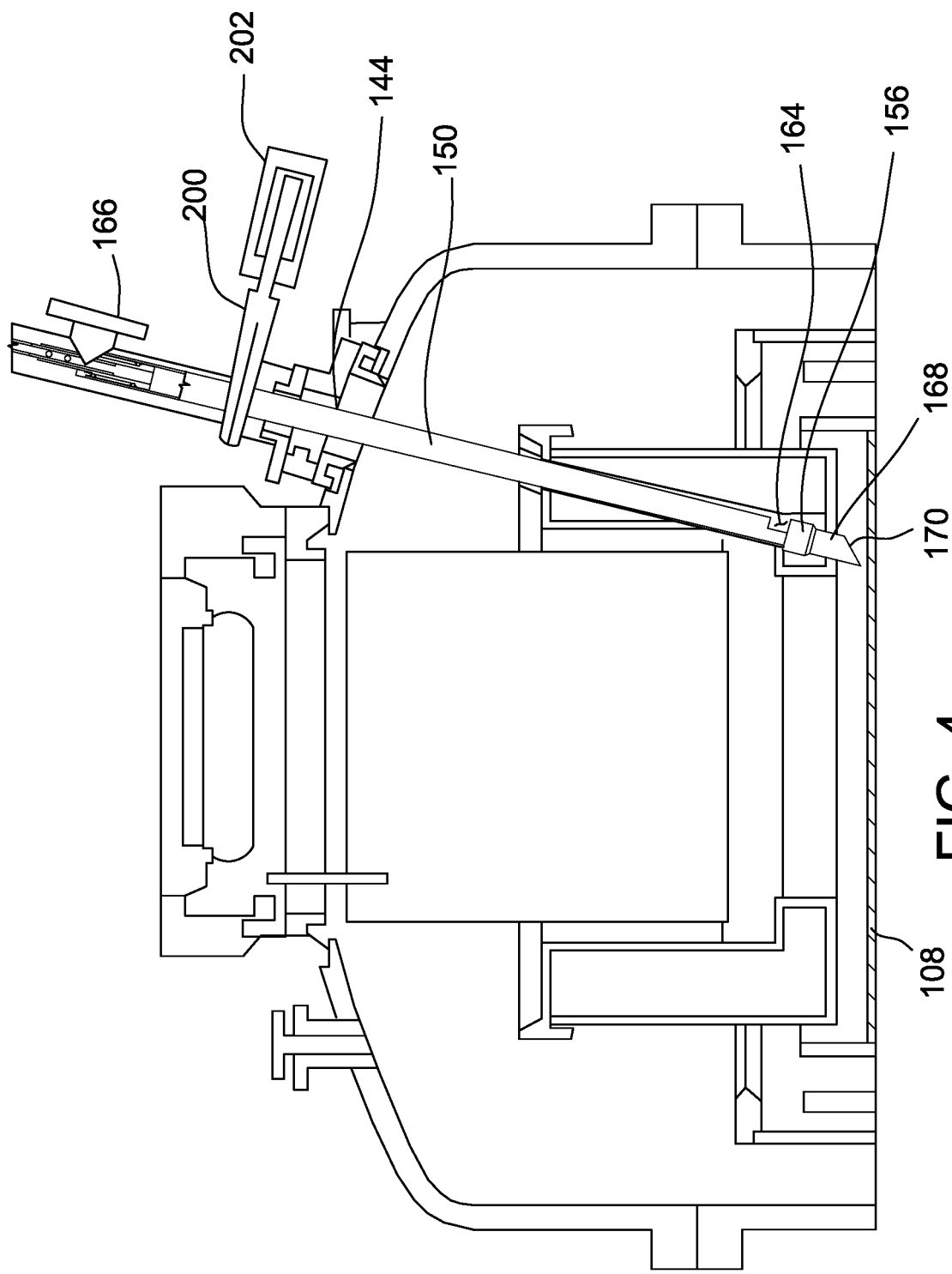
FIG. 4 is a detailed cross-section side view of the ingot puller apparatus with the dopant receptacle in the dopant feed position.
Figure 5:
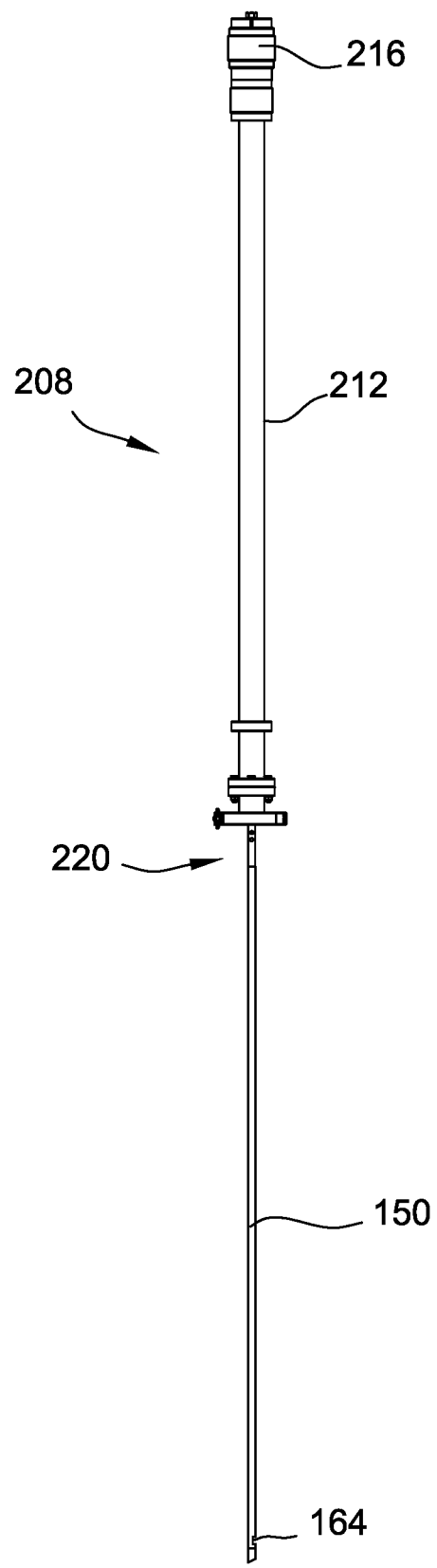
FIG. 5 is a side view of an elongate member that includes a dopant receptacle for holding solid-phase dopant and a translation unit for moving the elongate member.
Figure 6:
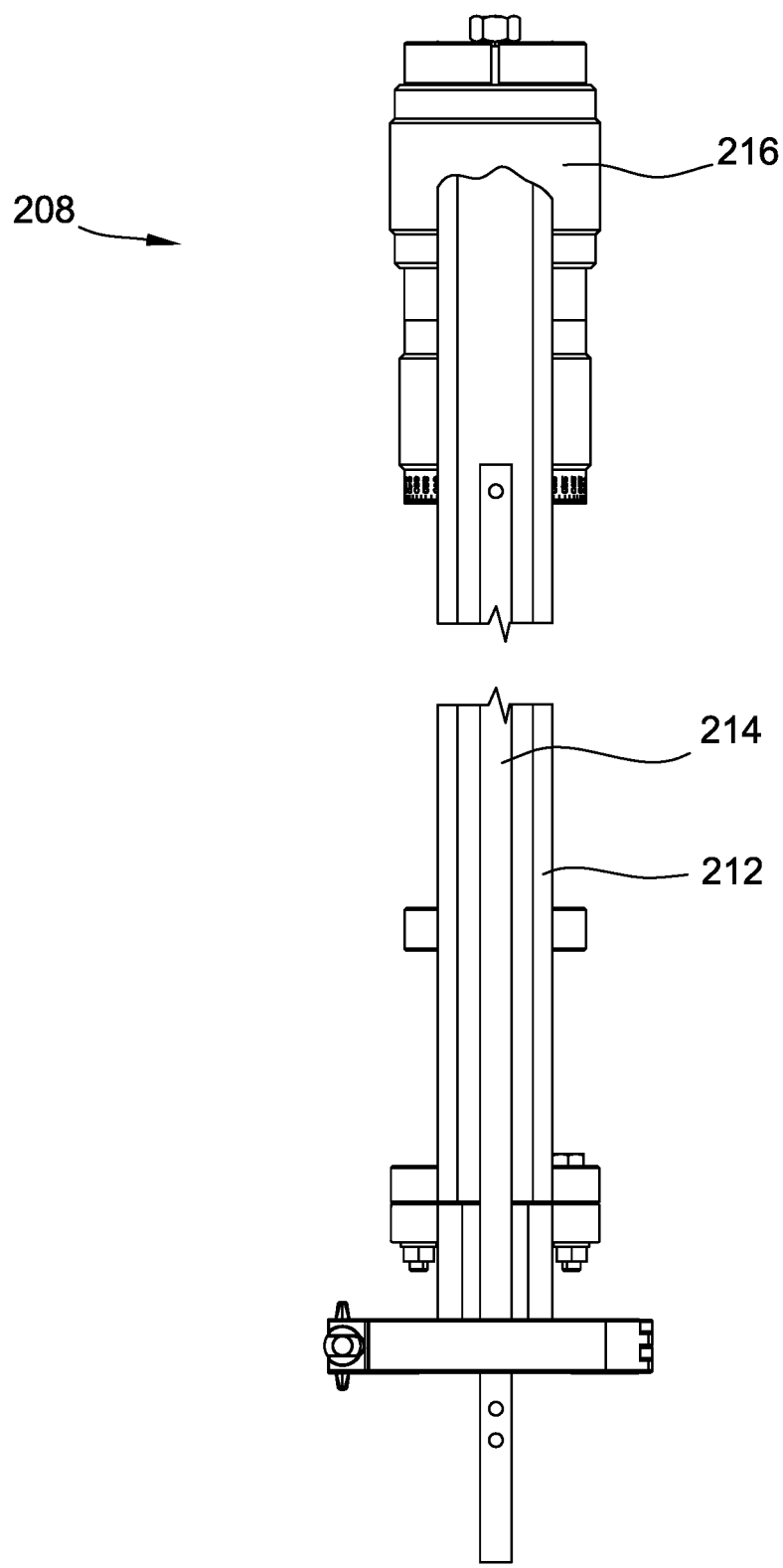
FIG. 6 is a side view of the translation unit.

An elongate member 150 is moveable within the outer feed tube 130 along the outer feed tube axis $A_{130}$. The elongate member 150 may be lowered into the ingot puller inner chamber 102 as shown in FIG. 4. In the illustrated embodiment, the elongate member 150 is a tube. In other embodiments, a rod or shaft may be used. The elongate member 150 may be made of any material that withstands the environment within the ingot puller chamber 102 such as quartz.

Figure 8:
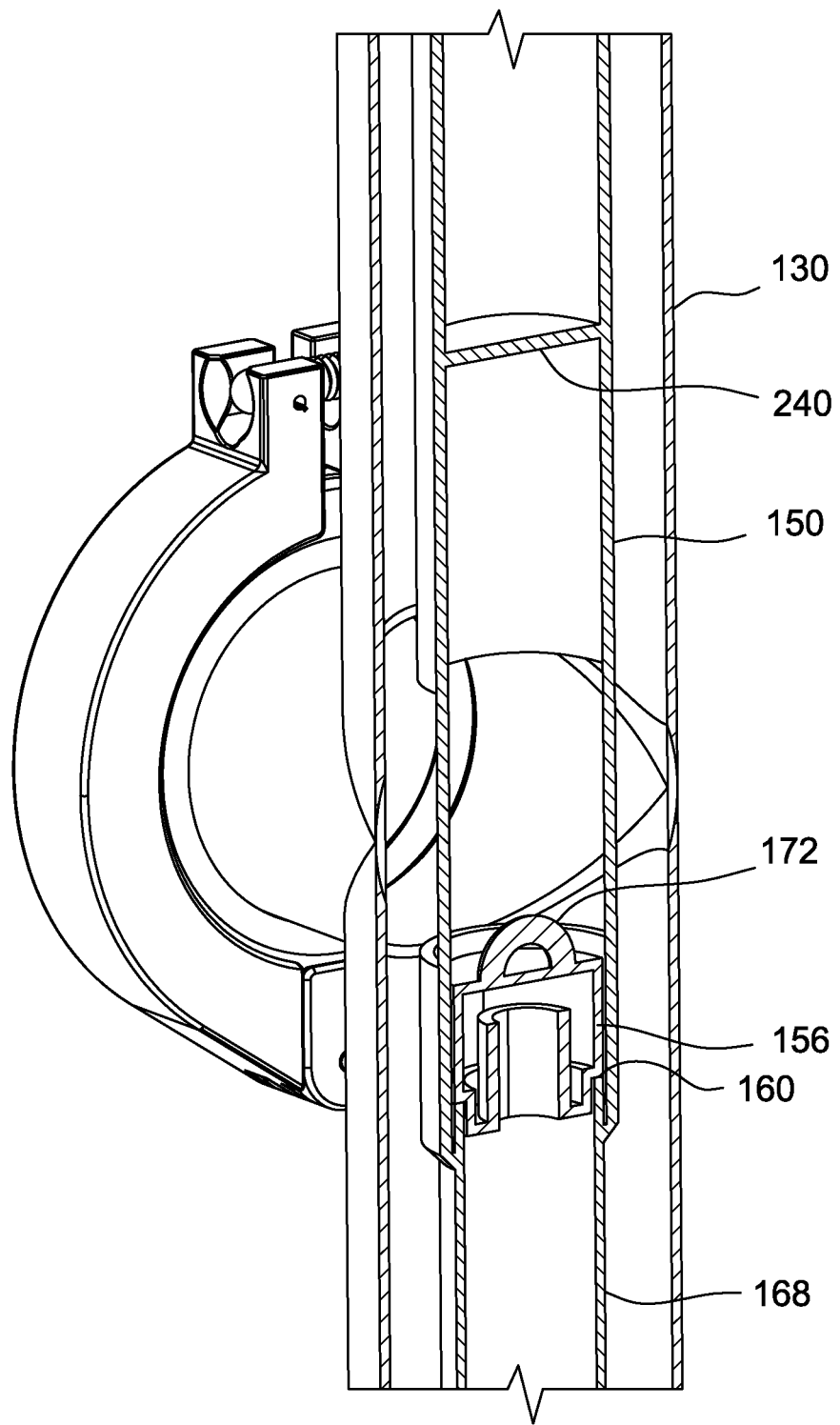
FIG. 8 is a perspective cross-section view of the elongate member within an outer tube with the receptacle in the dopant loading position.
Figure 9:
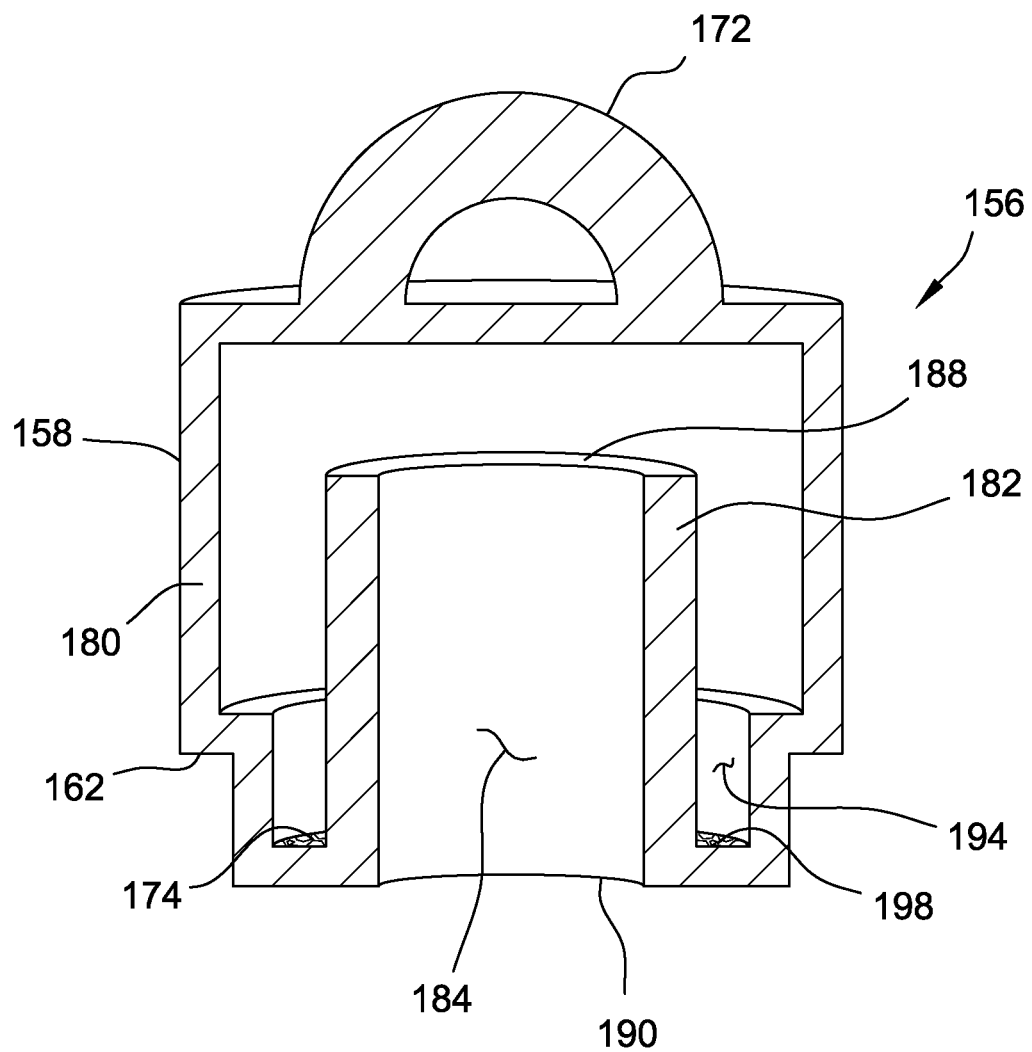
FIG. 9 is a cross-section side view of the receptacle.

A dopant receptacle 156 is coupled to the elongate member 150 (FIG. 4) (e.g., nested within it). As shown in FIG. 8, the receptacle 156 may abut a ledge 160 of the elongate member 150. The receptacle 156 may include a shoulder 162 (FIG. 9) that is seated on the ledge 160. By moving the elongate member 150, the dopant receptacle 156 moves between a raised position (FIG. 2, which may also be referred to as a "dopant loading position") in which the dopant receptacle 156 is disposed exterior to the ingot puller outer housing 116 and a lowered position (FIGS. 3 and 4, which may also be referred to as a "dopant feed position") in which the receptacle 156 is disposed within the ingot puller inner chamber 102 near the surface of the melt 108. The heat shield 120 may include a channel 124 (FIG. 2) formed therein to provide a pathway for the elongate member 150 and dopant receptacle 156 coupled thereto to approach the melt 108.

The receptacle 156 may be separable from the elongate member 150. The elongate member 150 includes a notch 164 (FIG. 5) that enables access to the receptacle 156. In the loading position (FIG. 2), the receptacle 156 may be removed from the elongate member 150 to charge it with dopant. The notch 164 is aligned with an access port 166 when the receptacle 156 is in the loading position to allow access to the receptacle 156. The receptacle 156 may be grasped by a connecting loop 172 of the receptacle 156 to pull the receptacle 156 through the notch 164 and access port 166. In other configurations, dopant may be added to the receptacle 156 when the receptacle 156 is disposed in the elongate member 150.

In the feed position of the receptacle (FIGS. 3 and 4), a dopant gas is produced from the solid-phase dopant. The dopant gas travels down an exit tube 168 and through an outlet 170 where it is directed to the surface of the melt 108.

In the illustrated embodiment, the receptacle 156 is a capsule 158 (FIG. 9) that holds the solid-phase dopant. The capsule 158 includes an outer capsule housing 180. A weir 182 is disposed within the outer capsule housing 180. The weir 182 forms a channel 184 therein. The weir 182 has an upper end 188 and a lower end 190 that are each open such that gas may pass through the channel 184. An annular chamber 194 is disposed between the weir 182 and the outer capsule housing 180. Solid dopant 174 (e.g., boric acid) is disposed within the annular chamber 194 and rests on the capsule floor 198. When the receptacle 156 is in its lowered position (FIGS. 3 and 4), the solid-phase dopant 174 heats which causes the dopant to either sublime or to melt and evaporate. The dopant gas rises in the annular chamber 194 and enters the weir channel 184 through the upper end 188 of the weir 182. The gas continues to pass down through the channel 184 and exits through the open lower end 190 of the weir 182. The dopant gas proceeds through the exit tube 168 (FIG. 4), through the tube outlet 170 and toward the surface of the melt.

The elongate member 150 includes a gas barrier wall 240 (FIG. 8) which prevents gas from back-flowing up the elongate member 150. Alternatively, the elongate member may be a rod or shaft which does not include a pathway for gas to back-flow.

Referring now to FIG. 4, the ingot puller apparatus 100 includes an isolation valve 200 within the outer feed tube 130. The isolation valve 200 seals the ingot puller inner chamber 102 when the elongate member 150 is withdrawn from the ingot puller inner chamber 102. This allows the dopant receptacle 156 to be accessed through the access port 166 while the port 166 is isolated from the inner chamber 102. When the elongate member 150 is lowered, the access port 166 may be closed or connected to a source of process gas (e.g., argon). The isolation valve 200 is connected to a valve controller 202 which actuates the valve 200.

Figure 3:
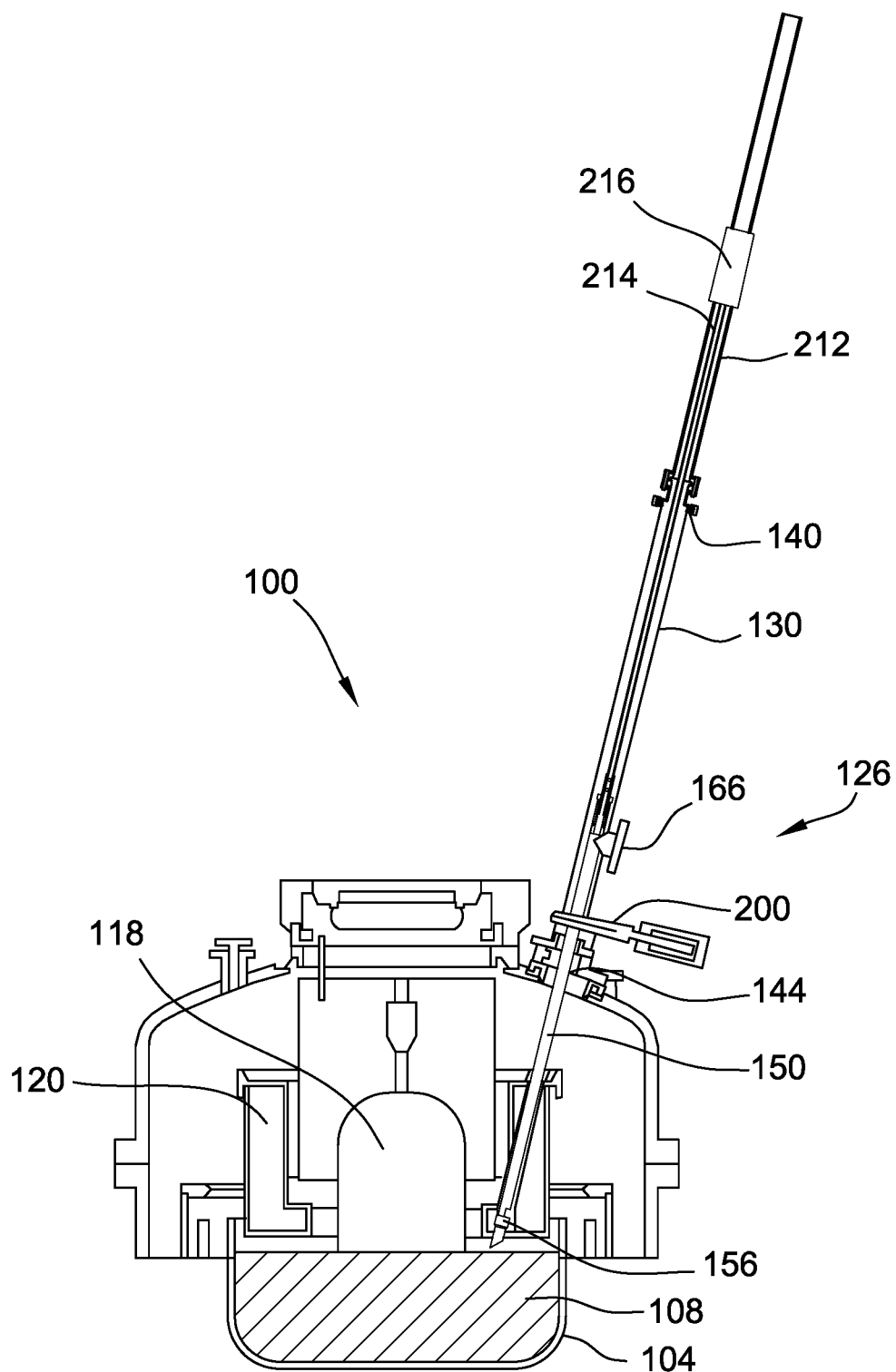
FIG. 3 is a partial cross-section side view of the ingot puller apparatus with the dopant receptacle in a dopant feed position.

The ingot puller apparatus 100 includes a translation device 208 (FIG. 2) for moving the dopant receptacle 156 between the dopant loading position (FIG. 2) and the dopant feed position (FIGS. 3 and 4). The translation device 208 moves the elongate member 150 and dopant receptacle 156 in and out of the inner chamber 102 of the ingot puller apparatus 100 and within the outer feed tube chamber 136 (i.e., along outer feed tube axis $A_{130}$). Generally, any translation device 208 that allows the receptacle 156 to be moved between the dopant loading and dopant feed positions of the receptacle 156 may be used unless stated otherwise.

In the illustrated embodiment, the translation device 208 is a magnetically coupled through-wall translation unit. The translation device 208 includes an outer tube 212 and an inner member 214 that moves within the outer tube 212. The inner member 214 is magnetically coupled to a translation device handle 216. The outer tube 212 may be made of stainless steel (non-magnetic) or other suitable materials. The translation device handle 216 and inner member 214 may have magnets embedded therein to enable magnetic coupling between the handle 216 and inner member 214.

Figure 7:
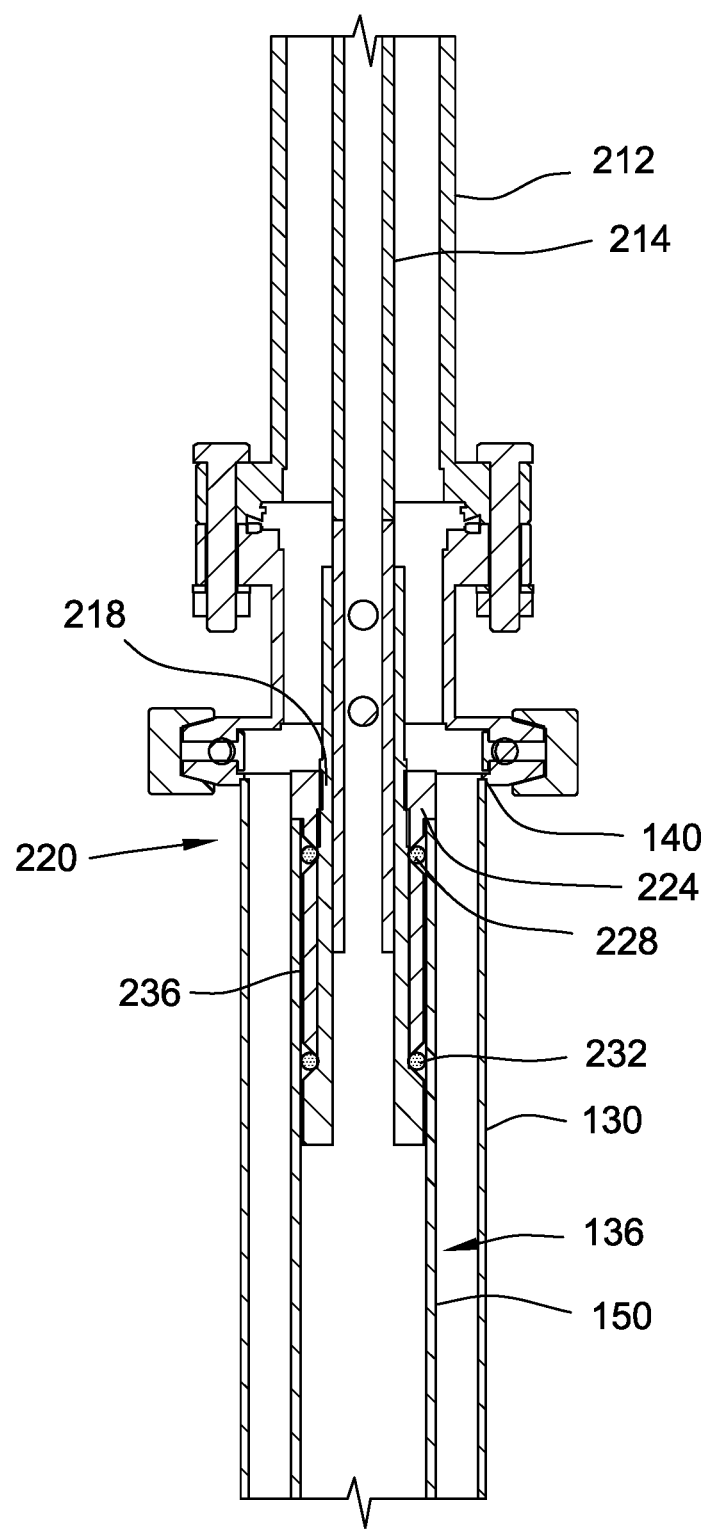
FIG. 7 is a cross-section side view of the joint between the elongate member and the translation unit.

The inner member 214 is also connected to the elongate member 150 at a joint 220 (FIG. 7). The example joint 220 includes a threaded member 224 that engages threads on a sleeve 218 that surrounds and is pinned to a lower portion of the inner member 214. The joint 220 includes first and second o-rings 228, 232 and a bushing 236 disposed between the o-rings 228, 232. The threaded member 224 compresses the o-rings 228, 232 causing them to move radially outward to facilitate a frictional connection between the translation device inner member 214 and the elongate member 150.

The handle 216 of the translation device 208 may be moved up and down along axis $A_{130}$ (FIG. 2). As the handle 216 moves, the inner member 214 moves within the outer tube 212. Because the inner member 214 is coupled to the elongate member 150, the elongate member 150 and receptacle 256 are caused to move in and out of the inner chamber 102 of the ingot puller apparatus 100. In some embodiments, when the receptacle 156 is in a lowered position for feeding dopant, the distance between the receptacle 156 and the melt 108 may be changed (e.g., by an operator) to vary the heat applied to the receptacle 156 and solid-phase dopant therein to control the rate at which dopant gas is produced. In other embodiments, the receptacle 156 may be moved between its loading position (FIG. 2) and the dopant feed position (FIGS. 3 and 4) by an actuator rather than manually.

As noted above, the translation device 208 may have other configurations. Other example translation devices may include a bellows system or an externally operated linear translation device (e.g., a rod attached to either an externally isolated linear rail or pneumatic cylinder). Any external actuator should be isolated from the heat and vacuum inside the inner chamber 102.

Figure 10:
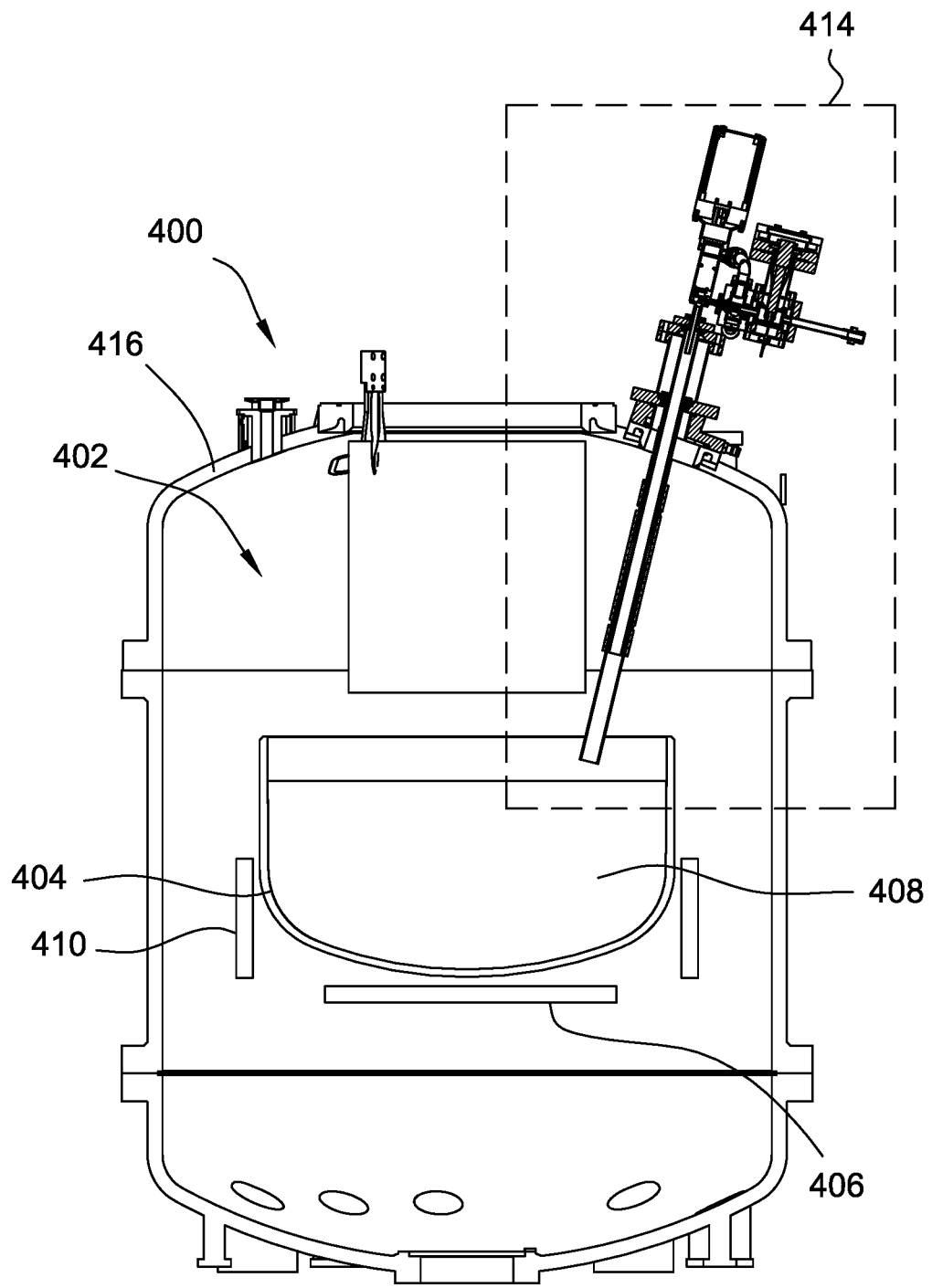
FIG. 10 is a cross-section side view of another embodiment of an ingot puller apparatus.
Figure 11:
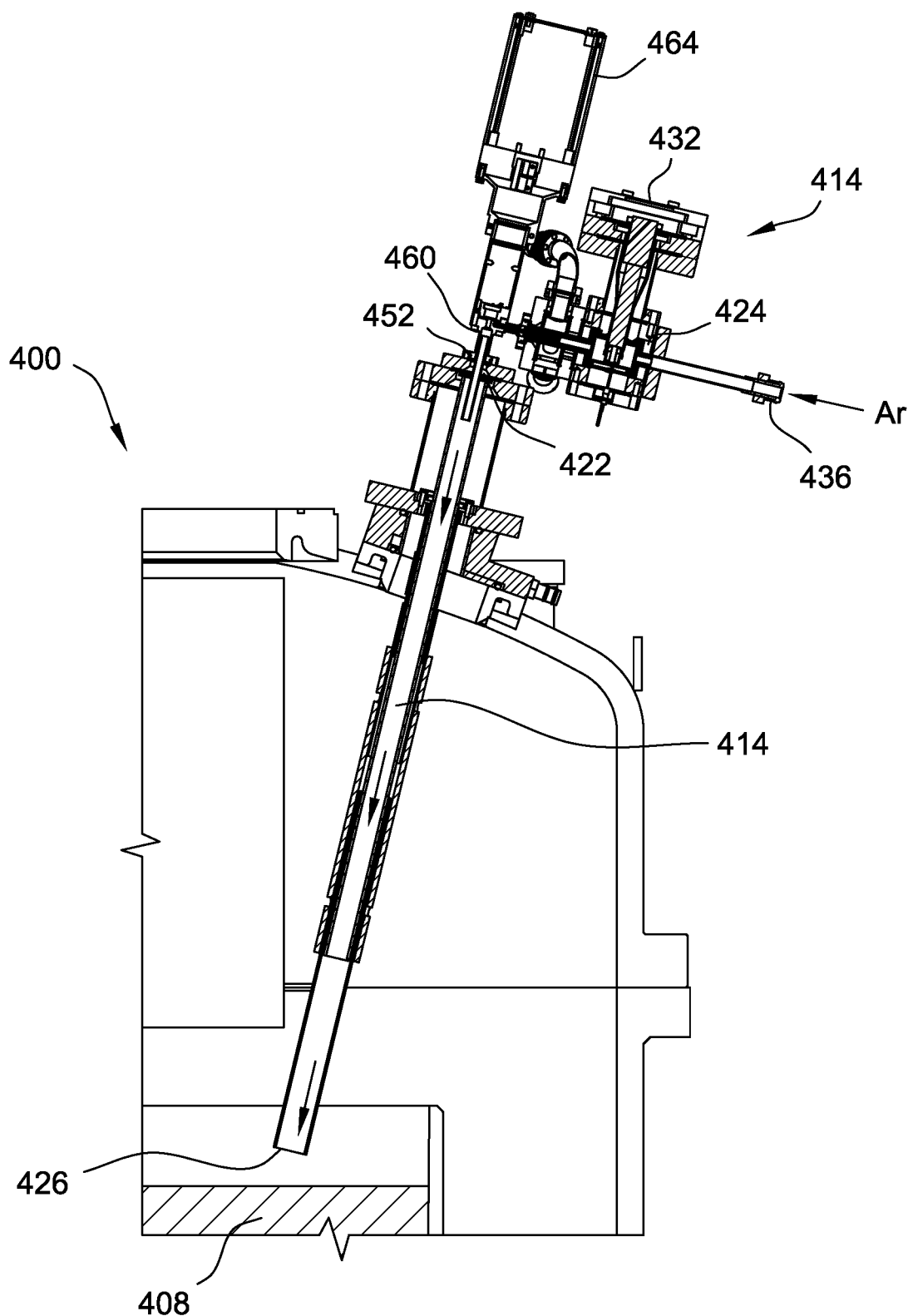
FIG. 11 is a cross-section side view of a vaporization unit of the ingot puller apparatus.
Figure 12:
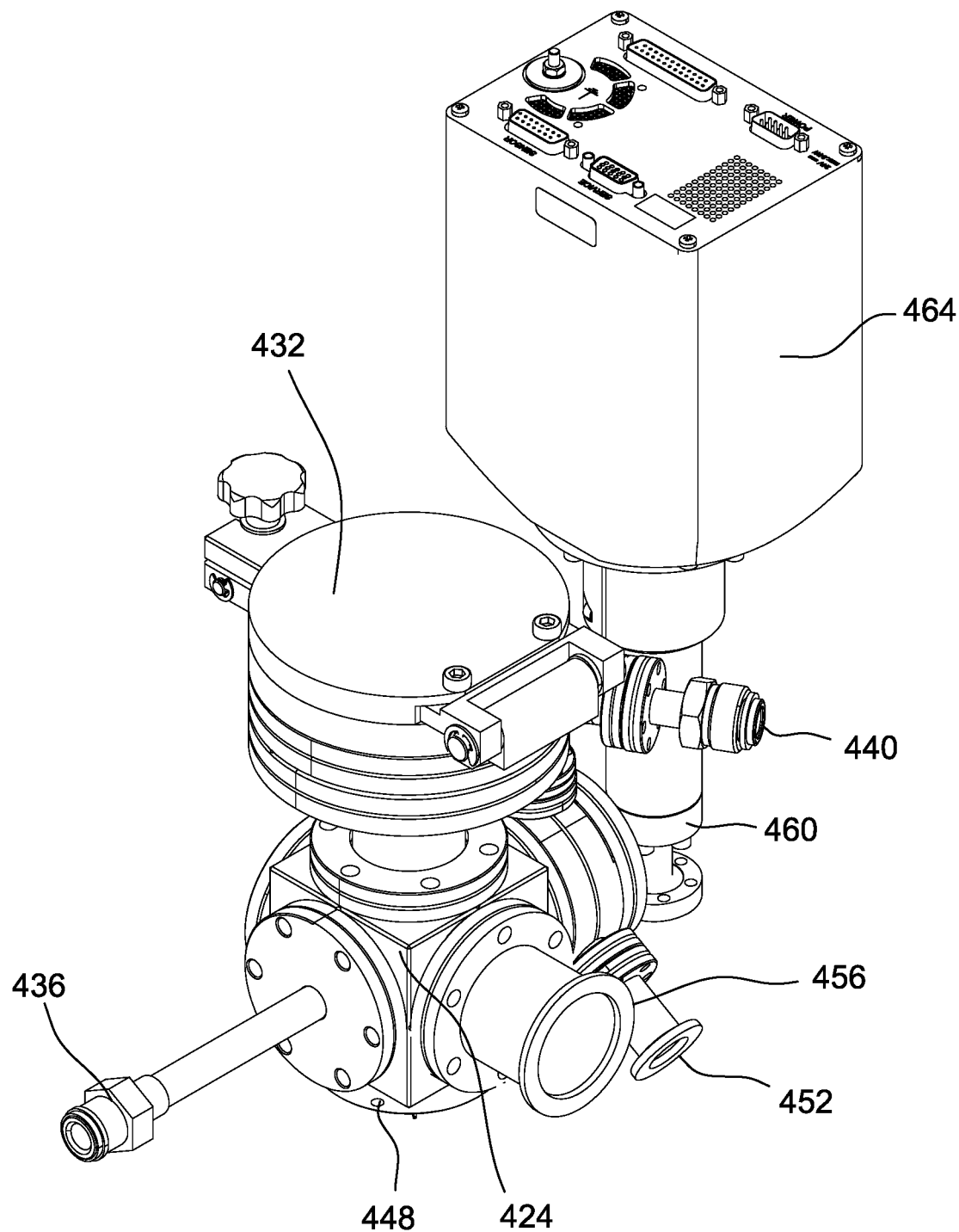
FIG. 12 is perspective view of the vaporization unit.

Another example ingot puller apparatus 400 is shown in FIGS. 10-11. The ingot puller apparatus 400 may operate similar to the ingot puller apparatus 100 described above and the operation of the apparatus 100 should be considered to be applicable to apparatus 400 (i.e., in aspects not related to use of the solid-phase dopant). For example, the ingot puller apparatus 400 includes an outer housing 416 that forms an inner chamber 402 within the housing 416. A crucible 404 for holding a silicon melt 408 therein is disposed in the chamber 402. The apparatus 400 includes a heat shield (not shown) that shrouds the ingot that is pulled from the melt and one or more heaters 406, 410 below or to the side of the crucible 404 to melt-down the silicon.

The ingot puller apparatus 400 includes a dopant vaporization unit 414 that feeds doped gas to a dopant conduit 430. The doped gas passes through the dopant conduit 430 to contact the melt 408 to cause the melt 408 to be doped. The dopant conduit 430 includes a gas inlet 422 (FIG. 11) disposed exterior to the ingot puller chamber 402 and a gas outlet 426 disposed in the ingot puller inner chamber 402 and positioned relatively near the surface of the melt 408.

The dopant vaporization unit 414 is disposed exterior to the ingot puller inner chamber 402. The dopant vaporization unit 414 includes a dopant chamber 424 (FIG. 13) for holding the solid-phase dopant (e.g., boric acid as discussed in the method above). A process gas (e.g., argon) may be circulated through the vaporization unit 414 through first and second process gas inlets 436, 440. A doped gas outlet 452 of the vaporization unit 414 is in fluid communication with the dopant conduit 430 (FIG. 11) to move doped gas to the surface of the melt 408.

Figure 13:
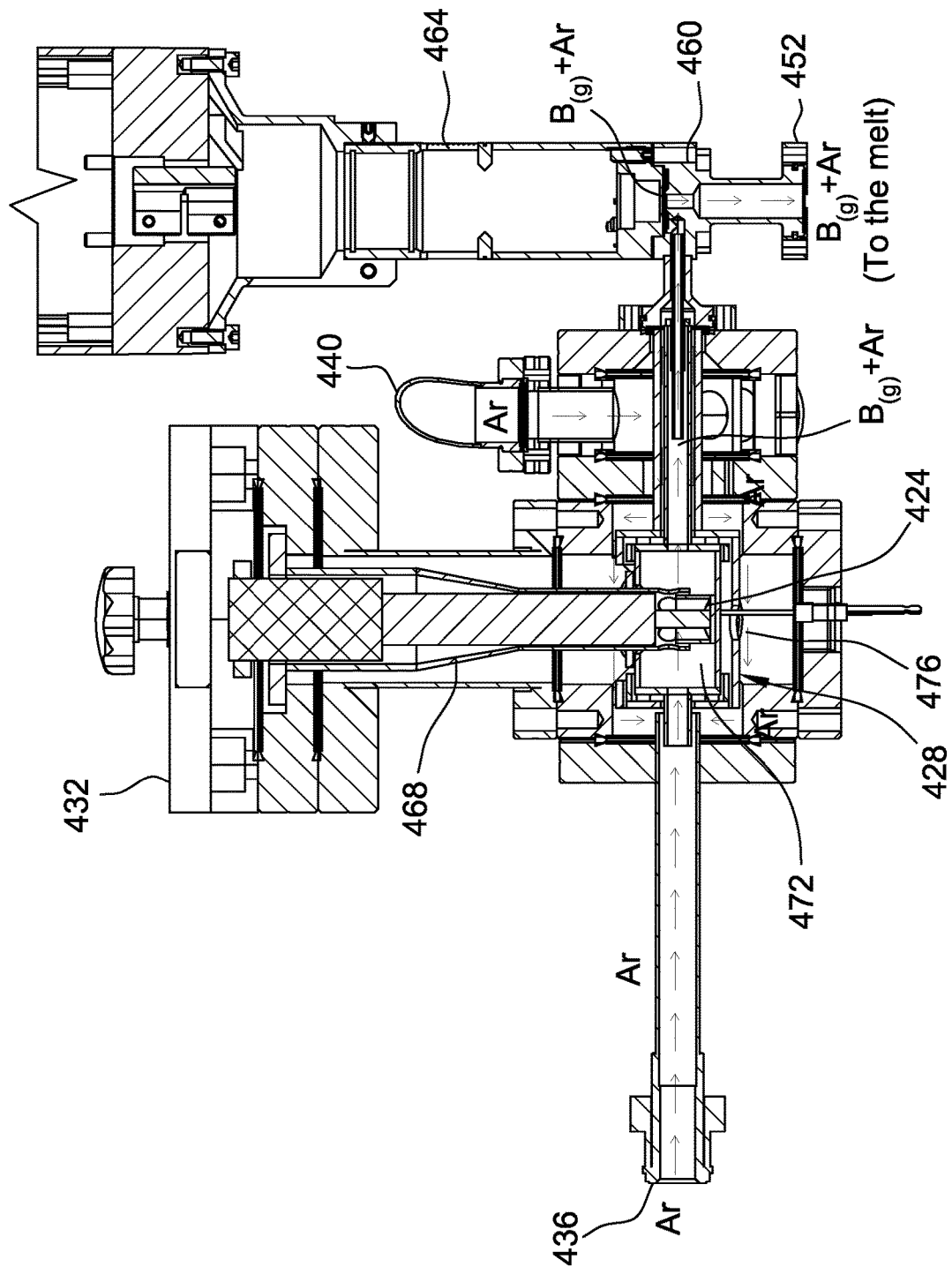
FIG. 13 is a detailed cross-section side view of the vaporization unit.

Surrounding the dopant chamber 424 is a heating chamber 472 (FIG. 13). A heating device 428 (e.g., resistive heating element) heats gases circulating in the vaporization unit 414. The heated gases contact the solid-phase dopant in the dopant chamber 242 causing a dopant gas to be produced (e.g., through sublimation or by liquefaction and vaporization of the solid-phase dopant). The dopant gas is picked up by the process gas to produce a doped process gas that is discharged through the doped gas outlet 452 and into the dopant conduit 430 (FIG. 11). The vaporization unit 414 includes a thermal shield 476 to reduce heat lost through the walls of the heating chamber 472. The heating chamber 472 may be made of quartz to reduce contamination.

An isolation valve 460 is within the process gas pathway downstream of the heating chamber 472 and dopant chamber 424. The isolation valve 460 isolates the vaporization unit 414 from the inner chamber 402 of the ingot puller apparatus 400 to seal the chamber 402 when dopant is not being added to the melt 408. A valve controller 464 may be used to actuate the valve 460.

The vaporization unit 414 includes a temperature sensor 448 (FIG. 12) to measure the temperature of the heating chamber 472 (FIG. 13). The temperature sensor 448 may send a signal to a control unit to vary the output of the heating device 428 based on the sensed temperature. The vaporization unit 414 includes a vacuum port 456 for pump-down, leak testing and to equalize the pressure with the ingot puller apparatus inner chamber 402 prior to opening isolation valve 460 for doping.

Compared to conventional methods for producing a single crystal silicon ingot from a silicon melt, the methods of embodiments of the present disclosure have several advantages. In embodiments in which the melt is counter-doped by using boric acid, a larger portion of the ingot may be within customer specifications (e.g., high resistivity) and/or a type-change in the ingot may be prevented. Solid-phase boric acid has a relatively low melting and vaporization temperatures which allows a dopant gas to be produced with relative ease.

Compared to conventional ingot puller apparatus, the ingot puller apparatus of embodiments of the present disclosure have several advantages. In embodiments in which a dopant receptacle is used to hold solid dopant, the receptacle may be placed in relative proximity to the melt surface which allows the heat of the melt to melt and vaporize the dopant. Positioning the receptacle near the melt also reduces or prevents the formation of precipitation or condensation of elemental boron or boron compounds that result in loss of crystal structure or integrity. Use of a dopant receptacle that includes a weir allows dopant particles to move within the receptacle without being propelled out of the receptacle and into the melt. Entry of dopant particles directly into the melt may cause loss of zero dislocation in the ingot. Use of an isolation valve allows the inner chamber of the ingot puller to be isolated from the solid-phase dopant system which prevents contamination of the melt and enables reloading of solid-phase dopant. Use of a magnetically coupled through-wall translation unit simplifies sealing and allows the system to be more robust (e.g., no separate seals) to maintain a gas-tight environment.

In embodiments in which the solid-phase dopant is converted to a gas by a vaporization unit exterior to the ingot puller housing, a heating device may be used to heat the dopant which allows for improved control of the rate at which dopant is added to the melt. The rate at which process gas is circulated through the vaporization unit may also be used to control the rate at which the melt is doped. In embodiments in which a feed tube or conduit is moveable within the ingot puller apparatus, the distance from the melt may be controlled which allows the rate of dopant addition to the melt to be controlled.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. An ingot puller apparatus for producing a doped single crystal silicon ingot, the ingot puller apparatus comprising:
   an ingot puller outer housing;
   an ingot puller inner chamber formed within the ingot puller outer housing;
   a crucible disposed within the ingot puller inner chamber;
   a dopant conduit having a gas inlet disposed exterior to the ingot puller inner chamber and a gas outlet disposed in the ingot puller inner chamber; and
   a dopant vaporization unit disposed exterior to the ingot puller inner chamber and comprising:
      a dopant chamber for holding solid-phase dopant;
      a heating device for heating the solid-phase dopant and producing a dopant gas;
      an outlet through which the dopant gas passes, the outlet being in fluid communication with the dopant conduit;
      a first inlet for introducing a process gas, the first inlet being exterior to the ingot puller outer housing, the first inlet being in fluid communication with the dopant chamber, the process gas passing through the dopant chamber and through the outlet;
      a second inlet for introducing a process gas, the second inlet being exterior to the ingot puller outer housing, the second inlet being in fluid communication with the dopant chamber; and
      an isolation valve within a process gas pathway downstream of the dopant chamber for isolating the vaporization unit from the ingot puller inner chamber.

2. The ingot puller apparatus as set forth in claim 1 comprising one or more heaters disposed below or to the side of the crucible, the heating device being separate from the one or more heaters disposed below or to the side of the crucible.

3. An ingot puller apparatus for producing a doped single crystal silicon ingot, the ingot puller apparatus comprising:
   an ingot puller outer housing;
   an ingot puller inner chamber formed within the ingot puller outer housing;
   a crucible disposed within the ingot puller inner chamber;
   one or more heaters disposed below or to the side of the crucible;
   a dopant conduit having a gas inlet disposed exterior to the ingot puller inner chamber and a gas outlet disposed in the ingot puller inner chamber; and
   a dopant vaporization unit disposed exterior to the ingot puller inner chamber and comprising:
      a dopant chamber for holding solid-phase dopant;
      a heating chamber that surrounds the dopant chamber;
      a heating device for heating the solid-phase dopant and producing a dopant gas, the heating device being separate from the one or more heaters disposed below or to the side of the crucible;
      a thermal shield to reduce heat lost through the heating chamber;
      an outlet through which the dopant gas passes, the outlet being in fluid communication with the dopant conduit; and
      an inlet for introducing a process gas, the inlet being exterior to the ingot puller outer housing, the inlet being in fluid communication with the dopant chamber, the process gas passing through the dopant chamber and through the outlet.

* * * * *